US008809207B2

(12) United States Patent
Ishikawa et al.

(10) Patent No.: US 8,809,207 B2
(45) Date of Patent: Aug. 19, 2014

(54) PATTERN-FORMING METHOD AND METHOD FOR MANUFACTURING SEMICONDUCTOR DEVICE

(75) Inventors: Hiraku Ishikawa, Sendai (JP); Teruyuki Hayashi, Nirasaki (JP); Takaaki Matsuoka, Tokyo (JP); Yuji Ono, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/000,643

(22) PCT Filed: Feb. 20, 2012

(86) PCT No.: PCT/JP2012/053986
§ 371 (c)(1),
(2), (4) Date: Aug. 27, 2013

(87) PCT Pub. No.: WO2012/115043
PCT Pub. Date: Aug. 30, 2012

(65) Prior Publication Data
US 2014/0080307 A1    Mar. 20, 2014

(30) Foreign Application Priority Data
Feb. 22, 2011    (JP) .................................. 2011-035594

(51) Int. Cl.
*H01L 21/00*    (2006.01)
(52) U.S. Cl.
USPC .......................................... 438/792; 438/791
(58) Field of Classification Search
USPC ................................................. 438/791–793
See application file for complete search history.

(56) References Cited

U.S. PATENT DOCUMENTS

| 2008/0122125 A1 | 5/2008 | Zhou |
| 2008/0211066 A1 | 9/2008 | Akedo et al. |
| 2009/0286401 A1 | 11/2009 | Ichinose et al. |

FOREIGN PATENT DOCUMENTS

| JP | 7-169833 A | 7/1995 |
| JP | 7-235615 A | 9/1995 |
| JP | 2003-297830 A | 10/2003 |
| JP | 2005-166400 A | 6/2005 |
| JP | 2008-214677 A | 9/2008 |
| JP | 2009-99938 A | 5/2009 |
| JP | 2009-246131 A | 10/2009 |
| JP | 2009-278039 A | 11/2009 |
| JP | 2010-511306 A | 4/2010 |
| JP | 2011-23718 A | 2/2011 |
| TW | 200903643 A | 1/2009 |
| TW | 200929355 A | 7/2009 |
| WO | 2008/067228 A1 | 6/2008 |

OTHER PUBLICATIONS

International Search Report mailed May 22, 2012 in PCT/JP2012/053986.

*Primary Examiner* — Richard Booth
(74) *Attorney, Agent, or Firm* — Rothwell, Figg, Ernst & Manbeck, P.C.

(57) ABSTRACT

A pattern-forming method for forming a predetermined pattern serving as a mask when etching film on a substrate includes the steps of: an organic film pattern-forming step for forming an organic film pattern on a film to be processed; forming a silicon nitride film on the organic film pattern; etching the silicon nitride film so that the silicon nitride film remains only on the lateral wall sections of the organic film pattern; and removing the organic film, thereby forming the predetermined silicon nitride film pattern on the film to be processed on a substrate. With the temperature of the substrate maintained at no more than 100° C., the film-forming step excites a processings gas and generates a plasma, performs plasma processing with the plasma, and forms a silicon nitride film having stress of no more than 100 MPa.

10 Claims, 14 Drawing Sheets

PATTERN-FORMING METHOD AND METHOD FOR MANUFACTURING SEMICONDUCTOR DEVICE

CROSS REFERENCE TO RELATED APPLICATIONS

This application is a 35 U.S.C. 371 National Phase Entry Application from PCT/JP2012/053986, filed Feb. 20, 2012, which claims the benefit of Japanese Patent Application No. 2011-035594, filed Feb. 22, 2011, the disclosures of which are incorporated herein in their entirety by reference.

TECHNICAL FIELD

The present disclosure relates to a pattern-forming method for forming a predetermined pattern on a film to be processed of a substrate and a method for manufacturing a semiconductor device.

BACKGROUND

In the semiconductor device manufacturing process, for example, a photolithography is performed in which various processings such as, e.g., a resist application processing to apply a resist liquid on a semiconductor wafer (hereinafter, referred to as "wafer") forming a resist film, an exposure processing to expose a predetermined pattern formed on the resist film, and a developing processing to develop the exposed resist film, are sequentially performed so that a predetermined resist pattern is formed on the wafer. Then, an etching processing of a film to be processed formed on the wafer is performed using the resist pattern as a mask, and then, for example, a removal processing of the resist film is performed so that the predetermined pattern is formed on the film to be processed.

In recent years, when forming a pattern of a film to be processed as described above, the pattern of the film to be processed has been required to be narrowed in order to ensure a higher integration of a semiconductor device. As a result, several methods have been developed including, for example, shortening the wavelength of the light used for an exposure processing. However, the method of forming a fine pattern of a film with, for example, a several-nanometer-order scale is facing a difficult situation due to the technical difficulties and cost limitations.

Therefore, it has been proposed to use a side wall transfer ("SWT") method which is one of so-called double patterning methods in which, for example, a silicon oxide film ($SiO_2$ film) is used as a sacrifice film and a mask is formed on the opposite lateral wall sections of a resist pattern. In the SWT method, a film is patterned in a pitch finer than the pitch of the resist pattern formed on a wafer by initially performing a photolithography processing. That is, in this method, a silicon oxide film is formed first on a resist pattern under a temperature environment of, for example, no more than 300° C. and the silicon oxide film is etched such that the silicon dioxide film remains only on the lateral wall sections of the resist pattern. Then, the resist pattern is removed and a silicon oxide film pattern is formed on the film to be processed of the wafer. The film to be processed is then etched using the fine pattern of the silicon oxide film formed in such a manner as a mask to form a fine pattern of the film to be processed on the wafer (Patent Document 1).

PRIOR ART DOCUMENT

Patent Document

Patent Document 1: Japanese Patent Laid-Open Publication No. 2009-99938

DISCLOSURE OF THE INVENTION

Problems to be Solved

However, when the silicon oxide film is formed using the method disclosed in Patent Document 1, a film stress of the silicon oxide film becomes high (for example, it becomes hundreds of MPa). In such a case, when the silicon oxide film is etched such that and the silicon oxide film remains only on the lateral wall sections of the resist film, the resist pattern may be deformed due to the film stress of the silicon oxide film. Also, when the resist pattern is removed thereafter, the silicon oxide film may collapse since the silicon oxide film is not capable of retaining a predetermined form. Therefore, the silicon oxide film may not be formed into a predetermined pattern and thus, the fine pattern of the film to be processed may not be made on the wafer.

Also, since the resist pattern is made of an organic material, the resist pattern may be damaged when the temperature of the wafer becomes high of, for example, 100° C. or more. In the method disclosed in Patent Document 1, since the silicon oxide film is formed on the resist pattern under a temperature environment of, for example, no more than 300° C., damages such as a collapsing of the resist pattern may be caused. In such a case, the silicon oxide film may not be formed into a predetermined pattern.

Further, when the silicon oxide film is used as a mask for etching the film to be processed, the silicon oxide film may not be used for the film to be processed and the selection ratio of selecting a film other than the silicon oxide film is low in many cases. Therefore, in this case, a film used as the film to be processed is limited.

The present disclosure has been made in consideration of such aspects and an object of the present disclosure is to properly form a mask for etching a film to be processed on a substrate in a predetermined pattern.

Means to Solve the Problems

To achieve the above-described object, the present disclosure provides a pattern-forming method for forming a predetermined pattern which serves as a mask when etching a film to be processed on a substrate. The method includes: an organic film pattern-forming step in which a pattern of an organic film is formed on a film to be processed of the substrate; then, a film-forming step in which a silicon nitride film is formed on the pattern of the organic film; and then, a silicon nitride film pattern-forming step in which the silicon nitride film is etched such that the silicon nitride film remains only on the lateral wall sections of the pattern of the organic film and then, the pattern of the organic film is removed to form the predetermined pattern of the silicon nitride film on the film to be processed of the substrate. In the film-forming step in a state in which the temperature of the substrate is maintained at no more than 100° C., a processing gas is excited to generate a plasma and a plasma processing by the plasma is performed to form the silicon nitride film having a film stress of no more than 100 MPa.

According to the present invention, in the film-forming step, since the silicon nitride film is formed in a state in which the temperature of the substrate is maintained at a low temperature of no more than 100° C., it is avoidable that the pattern of the organic film is damaged. Also, since the silicon nitride film has a low stress of no more than 100 MPa, the pattern of the organic film is not deformed in the silicon nitride film pattern-forming step and the silicon nitride film may also maintain the predetermined form even after the pattern of the organic film is removed. Therefore, the silicon nitride film which serves as a mask when etching the film to be processed on the substrate may be properly formed. Moreover, as compared to a conventional silicon oxide film, the silicon nitride has a high selection ratio in relation to the film to be processed. Therefore, when the silicon nitride film is used as a mask, the scope of application of an etchable film to be processed is broad.

According to another aspect of the present disclosure, a semiconductor device manufacturing method is provided. In the semiconductor device manufacturing method, a pattern of a silicon nitride film is formed on a wafer by performing a pattern-forming method which includes: an organic film pattern-forming step in which a pattern of an organic film is formed on a film to be processed of the substrate; then, a film-forming step in which a silicon nitride film is formed on the pattern of the organic film; and then, a silicon nitride film pattern-forming step in which the silicon nitride film is etched such that the silicon nitride film remains only on the lateral wall sections of the pattern of the organic film and then, the pattern of the organic film is removed to form the predetermined pattern of the silicon nitride film on the film to be processed of the substrate. Then, a semiconductor device is manufactured by etching the film to be processed on the substrate using the pattern of the silicon nitride film as a mask.

Effect of the Invention

According to the present invention, a mask when etching a film to be processed on a substrate may be properly formed with a predetermined pattern under a low temperature environment in which the temperature of the substrate is no more than 100° C.

BRIEF DESCRIPTION OF THE DRAWINGS

FIG. 10A illustrate an aspect in which a resist pattern is formed, FIG. 10B illustrates an aspect in which the resist pattern is trimmed and an antireflection film is etched, FIG. 10C illustrates an aspect in which a silicon nitride film is formed, and FIG. 10D illustrates an aspect in which a pattern of the silicon nitride film is formed.

FIG. 11A illustrates an aspect in which a resist pattern is formed, FIG. 11B illustrates an aspect in which the resist pattern is trimmed and an antireflection film is etched, FIG. 11C illustrates an aspect in which a silicon nitride film is formed, and FIG. 11D illustrates an aspect in which a pattern of the silicon nitride film is formed.

DETAILED DESCRIPTION TO EXECUTE THE INVENTION

Figure 1:
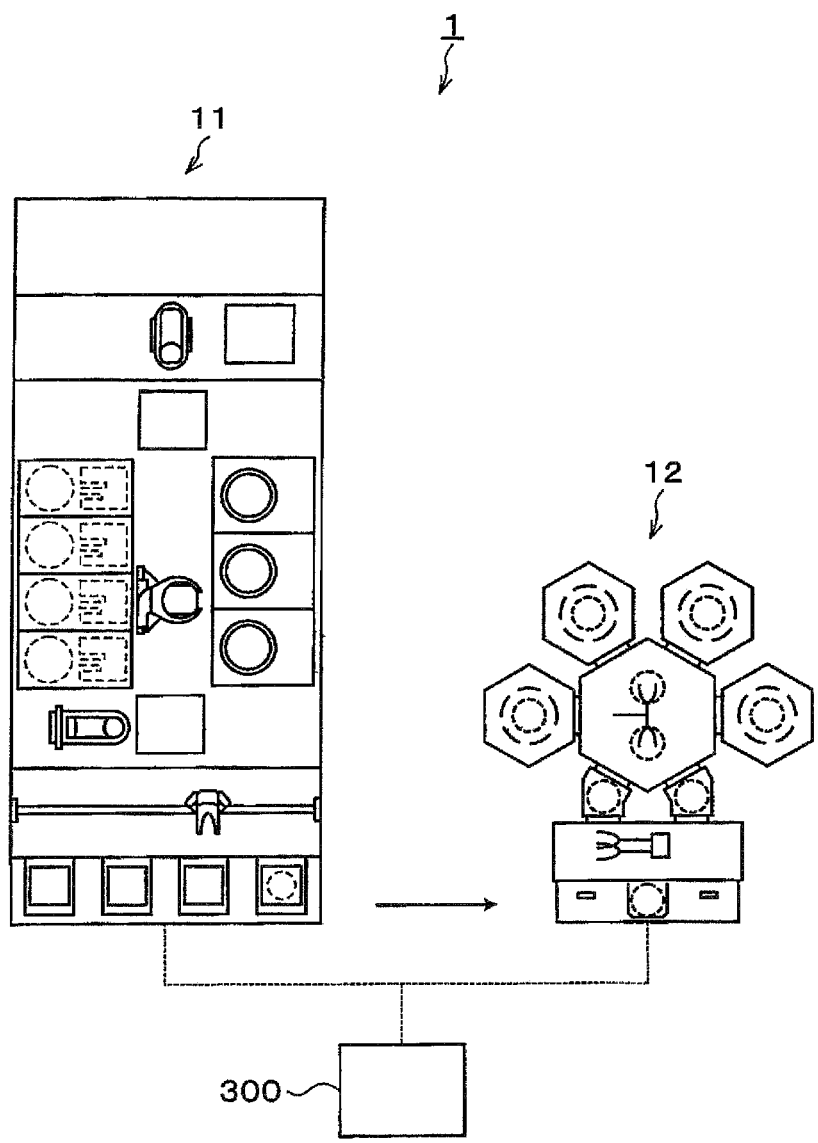
FIG. 1 is a plan view schematically illustrating a configuration of a substrate processing system for performing a pattern-forming method according to an exemplary embodiment.

Hereinafter, exemplary embodiments of the present invention will be described with reference to drawings. In the present specification and drawings, components that have substantially the same functional configurations will be assigned with the same symbols and redundant descriptions thereof will be omitted. FIG. 1 is a plan view schematically illustrating a configuration of a substrate processing system 1 to implement a pattern-forming method according to the present exemplary embodiment. Also, a film to be processed, for example, a polysilicon film is formed in advance on a wafer W as a substrate to be processed in the substrate processing system 1 of the present exemplary embodiment, as will be described later.

As illustrated in FIG. 1, the substrate processing system 1 includes a first processing unit 11 and a second processing unit 12 which are configured to perform a predetermined processing on a wafer W. The first processing unit 11 performs a photolithography processing on the wafer W and forms a resist pattern on the wafer W. The second processing unit 12 forms a silicon nitride film (SiN film) on the film to be processed of the wafer W.

Figure 2:
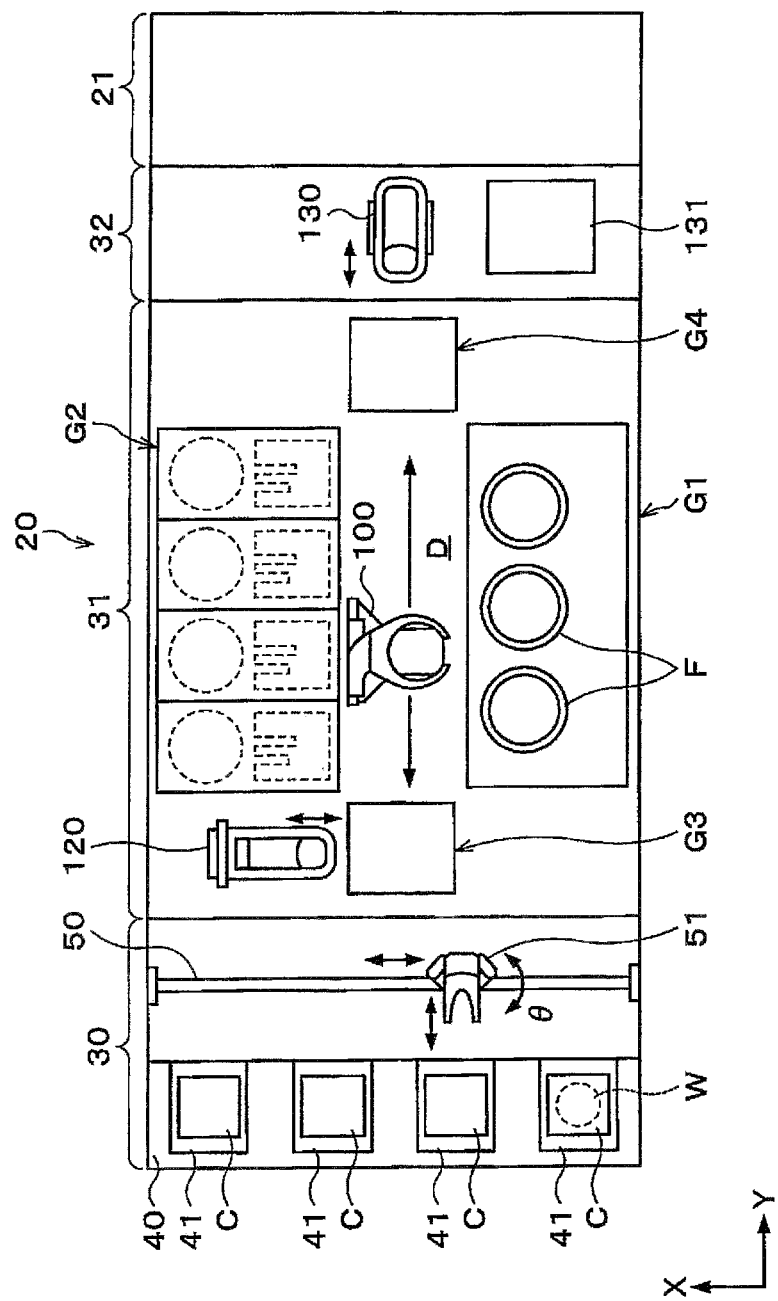
FIG. 2 is a plan view schematically illustrating a configuration of a first processing unit.

As illustrated in FIG. 2, the first processing unit 11 includes a coating/developing processing apparatus 20 and an exposure device 21. The coating/developing processing apparatus 20 has a configuration in which a cassette station 30 configured to carry in/out a cassette C accommodating a plurality of wafers W, for example, in relation to the outside, a processing station 31 provided with a plurality of various processing devices configured to implement a predetermined single wafer processing during a photolithography processing, and an interface station 32 disposed adjacent to the processing station 31 and configured to perform the transfer of the wafers W between the processing station 31 and the exposure device 21 are integrally connected to each other.

The cassette station 30 is provided with a cassette mounting table 40. The cassette mounting table 40 is provided with a plurality of, for example, four cassette mounting sections 41. The cassette mounting sections 41 are disposed in a line in the X direction of horizontal direction (vertical direction in FIG. 2). Cassettes C may be disposed on these cassette mounting sections 41 when the cassettes C are carried in/out in relation to the outside of the coating/developing processing apparatus 20.

The cassette station 30 includes a wafer conveyance device 51 configured to be movable on a conveyance path 50 extending in the X direction. The wafer conveyance device 51 is movable in the vertical direction and around the vertical axis (θ direction) and may convey the wafers W between the cassette C on each of the cassette mounting sections 41 and a transfer device of a third block G3 of the processing station 31 to be described later.

The processing station 31 includes a plurality of, for example, four blocks G1, G2, G3, G4 which are provided with various devices. For example, a first block G1 is provided on the front side of the processing station 31 (at the minus direction side of X direction in FIG. 2) and a second block G2 is provided on the rear side of the processing station 31 (at the plus direction side of X direction in FIG. 2). Also, a third block G3 is provided on the cassette station 30 side of the processing station 31 (at the minus direction side of Y direction in FIG. 2) and a fourth block G4 is provided on the interface station 32 side of the processing station 31 (at the plus direction side of Y direction in FIG. 2).

Figure 4:
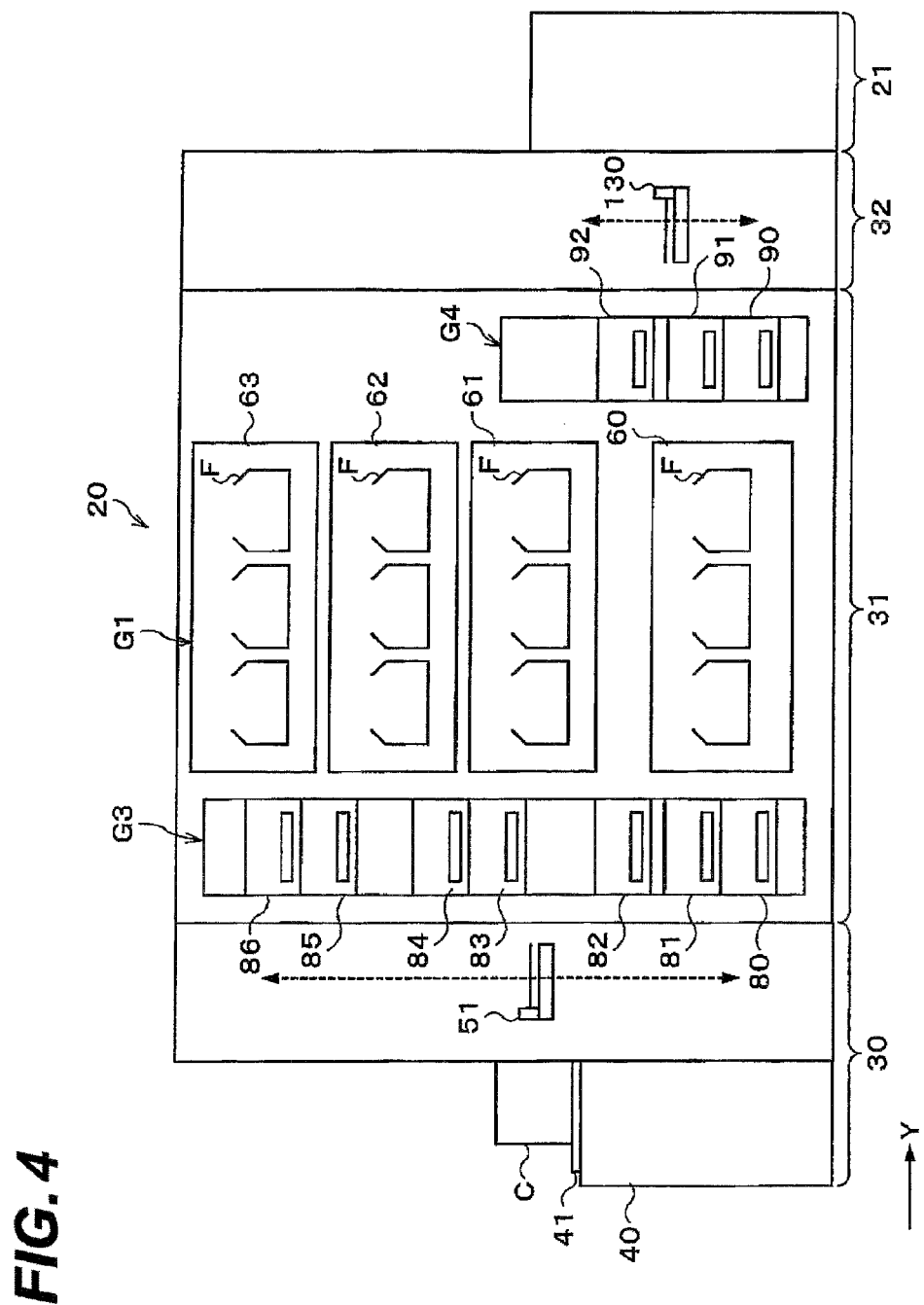
FIG. 4 is a side view schematically illustrating a configuration of the first processing unit

For example, in the first block G1, as illustrated in FIG. 4, a plurality of liquid processing devices, for example, a developing device 60 configured to perform a development processing of a wafer W, an antireflection film forming device 61 configured to form an antireflection film on a lower layer of a resist film of the wafer W, and resist application devices 62, 63 configured to apply a resist liquid to form the resist film are sequentially stacked from the bottom with four layers.

For example, each of the devices 60 to 63 of the first block G1 has a plurality of cups F configured to accommodate wafers W at the time of processing in the horizontal direction and may process a plurality of wafers W at the same time.

Figure 3:
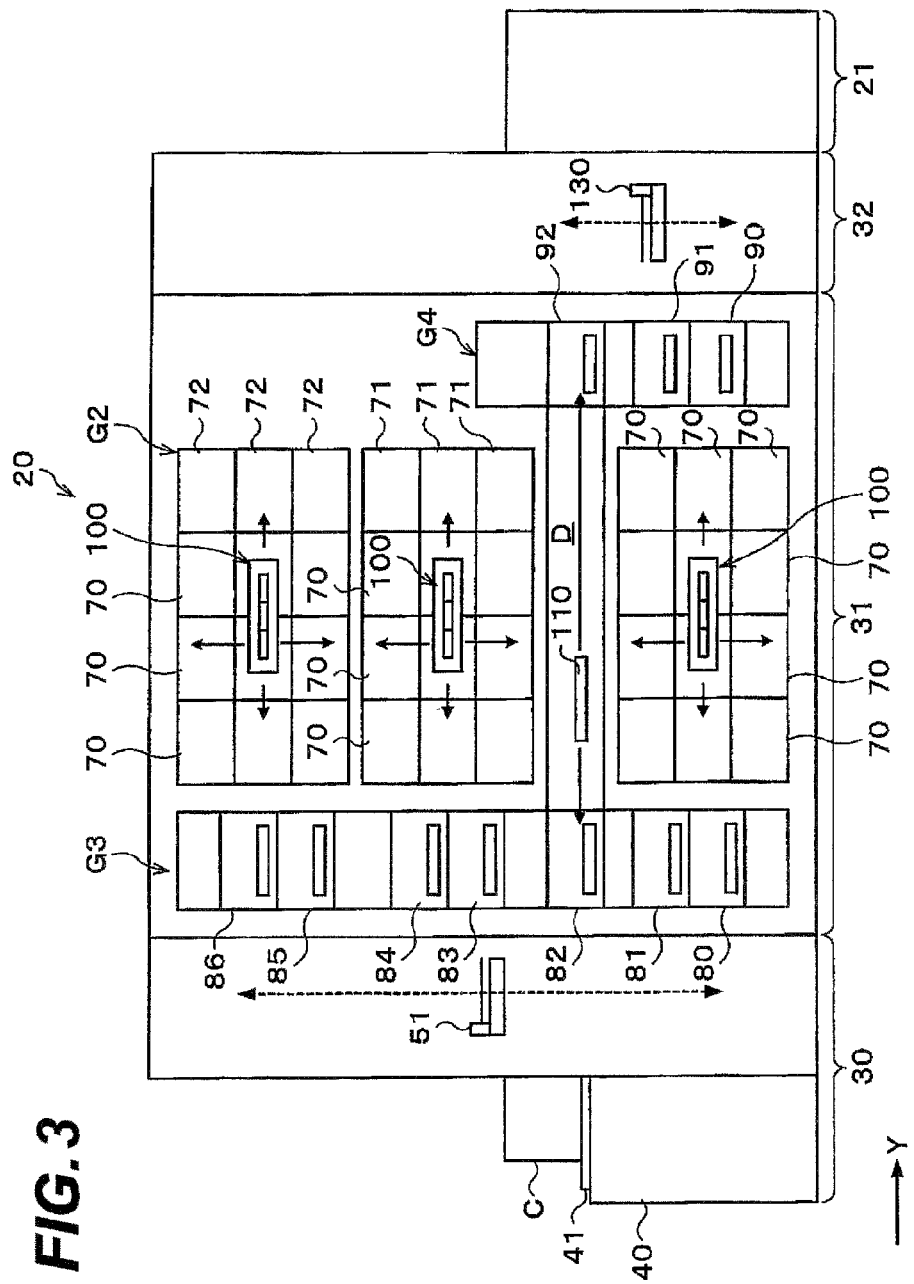
FIG. 3 is a side view schematically illustrating a configuration of the first processing unit.

For example, in the second block G2, as illustrated in FIG. 3, heat treatment devices 70 configured to perform a heat treatment, adhesion devices 71 configured to perform a hydrophobic conversion processing on the wafers W, and peripheral exposure devices 72 configured to expose an outer circumferential portion of the wafers W are arranged in the vertical and horizontal directions. Each of the heat treatment devices 70 includes a heat plate where a wafer W is disposed and heated and a cooling plate where the wafer is disposed and cooled and may perform both a heating processing and a cooling processing. Also, the number or the arrangement of the heat treatment devices 70, the adhesion devices 71, and the peripheral exposure devices 72 may be arbitrarily selected.

For example, the third block G3 is provided with a plurality of transfer devices 80, 81, 82, 83, 84, 85, 86 sequentially from the bottom. Also, the fourth block G4 is provided with a plurality of transfer devices 90, 91, 92 sequentially from the bottom.

As illustrated in FIG. 2, in a region surrounded by the first block G1 to the fourth block G4, a wafer conveyance region D is formed. In the wafer conveyance region D, for example, a wafer conveyance device 100 is disposed.

The wafer conveyance device 100 has a conveyance arm which is movable in, for example, the Y direction, the X direction, the θ direction, and the vertical direction. The wafer conveyance device 100 moves within the wafer conveyance region D and may convey wafers W to appointed devices within the first block G1, second block G2, third block G3, and fourth block G4 around the wafer conveyance region D.

For example, as illustrated in FIG. 3, a plurality of wafer conveyance devices 100 are vertically disposed and may convey wafers W, for example, to appointed devices of substantially the same height of each of the blocks (G1 to G4).

Also, in the wafer conveyance region D, a shuttle conveyance device 110 configured to convey the wafer W rectilinearly between the third block G3 and the fourth block G4 is provided.

The shuttle conveyance device 110 is adapted to move rectilinearly, for example, in the Y direction. The shuttle conveyance device 110 moves in the Y direction while supporting a wafer W and may convey the wafer W between the transfer device 82 of the third block G3 and the transfer device 92 of the fourth block G4.

As illustrated in FIG. 2, a wafer conveyance device 120 is provided next to the third block G3 at the plus direction side of the X direction. The wafer conveyance device 120 has a conveyance arm which is movable in, for example, the X direction, the θ direction, and the vertical direction. The wafer conveyance device 120 moves vertically while supporting a wafer W and may convey the wafer W to each of the transfer devices within the third block G3.

The interface station 32 includes a wafer conveyance device 130 and a transfer device 131. The wafer conveyance device 130 has an arm which is movable in, for example, the Y direction, the θ direction, and the vertical direction. The wafer conveyance device 130, for example, may convey the wafer W to the each of the transfer devices within the fourth block G4 having the wafer W supported by the conveyance arm.

Figure 5:
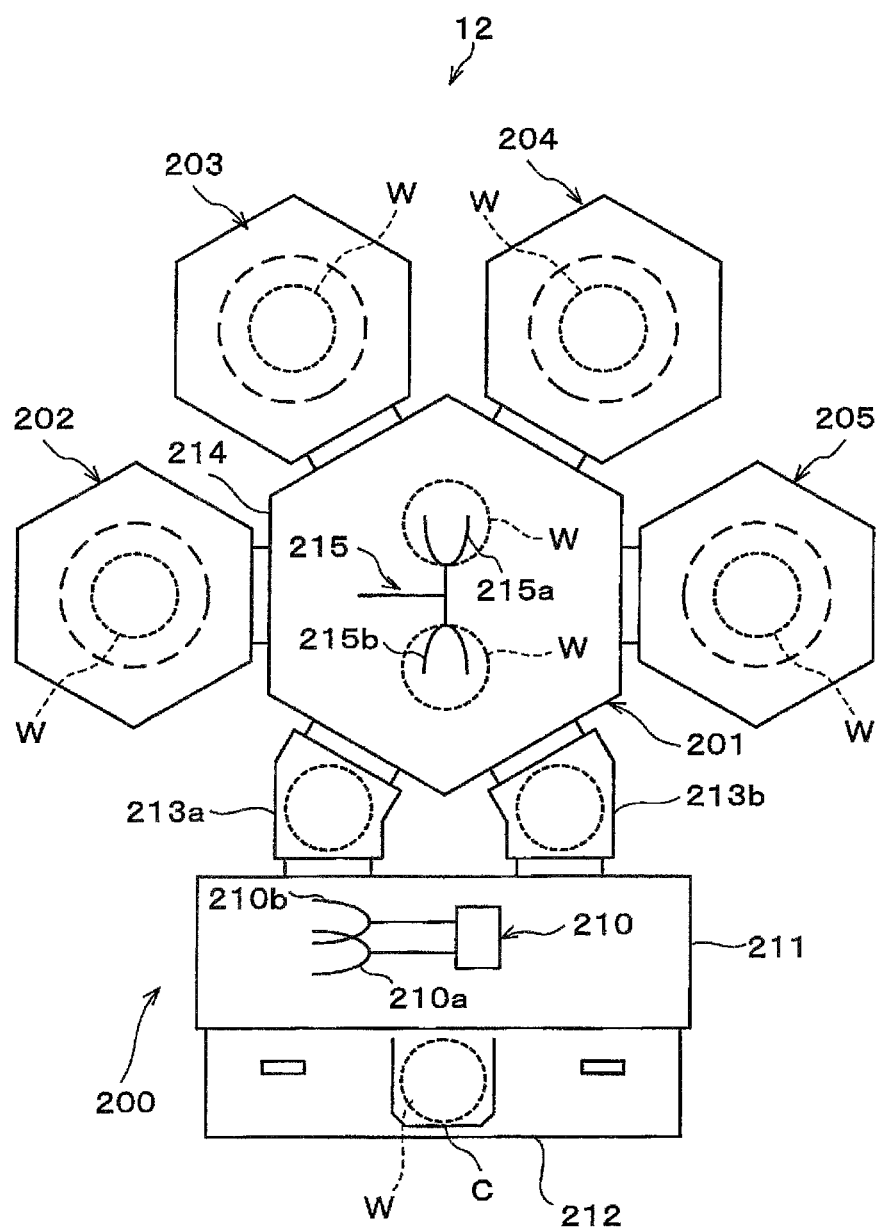
FIG. 5 is a plan view schematically illustrating a configuration of a second processing unit.

As illustrated in FIG. 5, the second processing unit 12 includes a cassette station 200 configured to carry in/out the wafer in relation to the second processing unit 12, a common conveyance unit 201 configured to convey a wafer W, and an etching device 202, and further includes a plasma film forming device 203, an etching device 204, and an ashing device 205 which are configured to perform a predetermined processing on the wafer W.

The cassette station 200 includes a conveyance room 211 which is provided with a wafer conveyance mechanism 210 configured to convey the wafer W therein. The wafer conveyance mechanism 210 has two conveyance arms 210*a*, 210*b* configured to retain the wafer W substantially horizontally, and is configured to convey the wafer W while retaining the wafer W by either of the conveyance arms 210*a*, 210*b*. At a side of the conveyance room 211, a cassette mounting table 212 is provided where a cassette C configured to accommodate a plurality of wafers W side by side is mounted. In the illustrated example, the cassette mounting table 212 is configured such that a plurality of, for example, three cassettes C may be mounted on the cassette mounting table 212.

The conveyance room 211 and the common conveyance unit 201 are connected to each other via two load-lock devices 213*a*, 213*b* which may be subjected to a vacuum processing.

The common conveyance unit 201, for example, has a conveyance room chamber 214 which is sealably configured and formed in a substantially polygonal shape (a hexagon shape in the illustrated example) when viewed from the top. In the conveyance room chamber 214, a wafer conveyance mechanism 215 configured to convey a wafer W is provided.

The wafer conveyance mechanism 215 has two conveyance arms 215a, 215b configured to retain the wafer W substantially horizontally, and is configured to convey the wafer W while retaining the wafer W by either of the conveyance arms 215a, 215b.

At the outer side of the conveyance room chamber 214, the etching device 202, the plasma film forming device 203, the etching device 204, the ashing device 205, and the load-lock devices 213b, 213a are disposed to surround the periphery of the conveyance room chamber 214. The etching device 202, the plasma film forming device 203, the etching device 204, the ashing device 205, the load-lock devices 213b, 213a are disposed to be arranged clockwise in the plan view and to oppose to the six side planar portions of the conveyance room chamber 214, respectively.

Also, the configuration of the plasma film forming device 203 will be described in detail below. Further, as for the other processing devices such as the etching devices 202, 204 and the ashing device 205, conventional devices may be used and the description of the configuration thereof will be omitted.

Next, the configuration of the above-described plasma film forming device 203 will be described. Also, the plasma film forming device 203 of the present exemplary embodiment is a chemical vapor deposition ("CVD") device which uses a radial line slot antenna to generate plasma.

Figure 6:
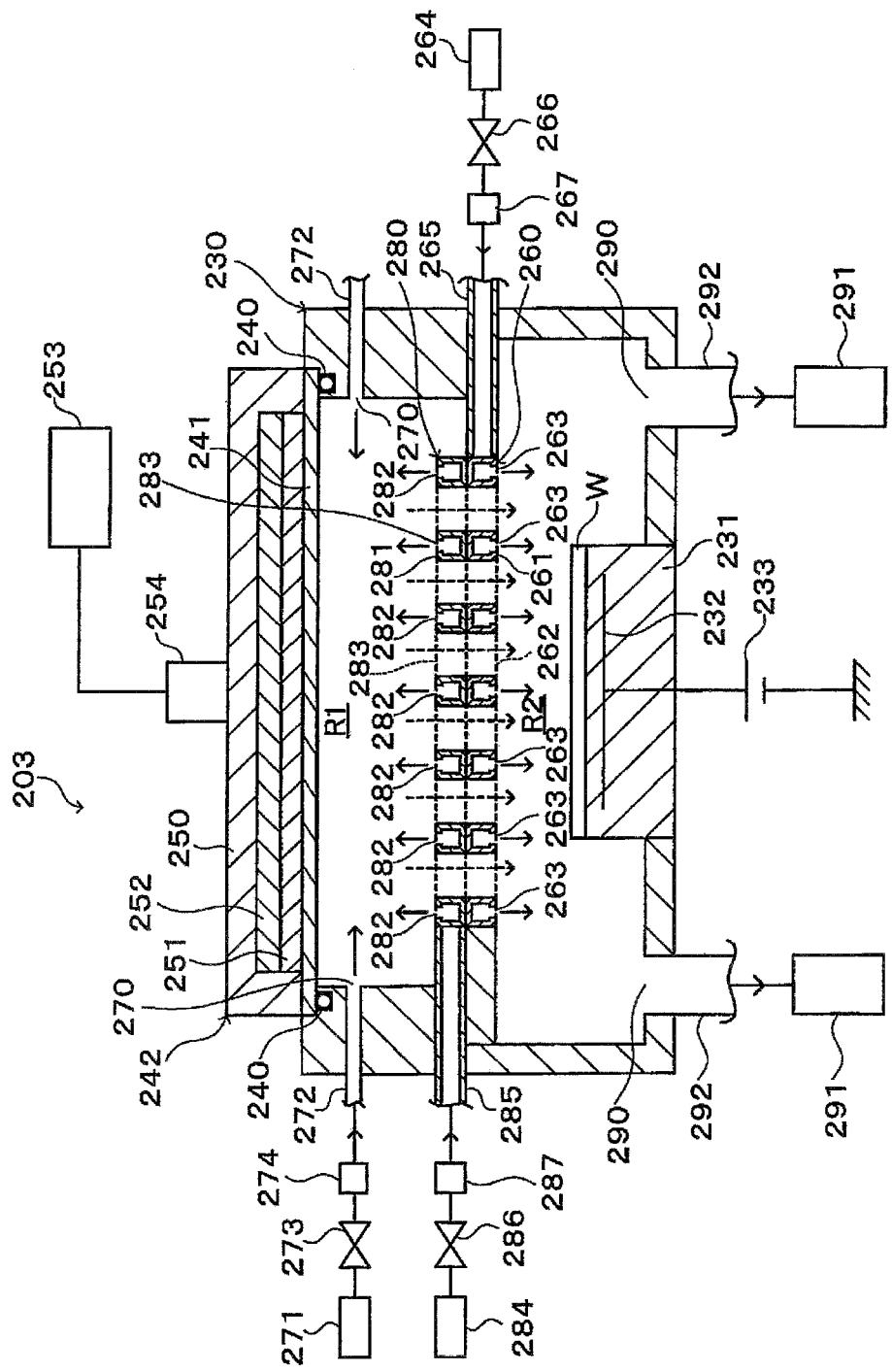
FIG. 6 is a cross-sectional view schematically illustrating a configuration of a plasma film-forming device.

As illustrated in FIG. 6, the plasma film forming device 203 is provided with, for example, a cylindrical processing container 230 which is opened at the top side thereof and has a bottom. The processing container 230 is formed of, for example, an aluminum alloy. Also, the processing container 230 is grounded. At the substantially central portion of the bottom part of the processing container 230, for example, a mounting table 231 configured to mount a wafer W is provided.

For example, an electrode plate 232 is housed in the mounting table 231 and connected to a DC power supply 233 provided outside of the processing container 230. The DC power supply 233 generates an electrostatic force on the surface of the mounting table 231 such that the wafer W is electrostatically adsorbed to the mounting table 231. Also, the electrode plate 232 may be connected to, for example, a radio frequency power supply for bias (not illustrated).

At the top side opening of the processing container 230, a dielectric window 241 is provided, for example, through a seal member 240 such as an O ring for securing airtightness. The interior of the processing container 230 is closed by the dielectric window 241. A radial line slot antenna 242 configured to supply microwaves for generating plasma is provided at the top side of the dielectric window 241. Also, the dielectric window 241 is formed of, for example, alumina ($Al_2O_3$). In such a case, the dielectric window 241 is resistant to nitrogen trifluoride ($NF_3$) gas used for dry cleaning. Further, in order to further improve the resistance to the nitrogen trifluoride gas, the surface of the alumina of the dielectric window 241 may be coated with yttrium oxide ($Y_2O_3$).

The radial line slot antenna 242 is provided with a substantially cylindrical antenna main body 250 of which the bottom surface is open. At the opening of the bottom surface of the antenna main body 250, a disc-shaped slot plate 251 formed with a large number of slots is provided. At the top side of the slot plate 251 within the antenna main body 250, a dielectric plate 252 formed of a low loss dielectric material is provided. A coaxial waveguide 254 communicating with a microwave oscillator 253 is connected to the top surface of the antenna main body 250. The microwave oscillator 253 is provided outside of the processing container 230 and may oscillate a microwave with a predetermined frequency, for example, a microwave of 2.45 GHz in relation to the radial line slot antenna 242. By such a configuration, the microwave oscillated from the microwave oscillator 253 is propagated into the radial line slot antenna 242 and compressed by the dielectric plate 252 such that the wavelength of the microwave is shortened. Then, the microwave generates a circularly polarized wave at the slot plate 251 to be radiated toward the inside of the processing container 230 from the dielectric window 241.

A raw material gas supplying structure 260 of, for example, a substantially flat plate shape is provided between the mounting table 231 and the radial line slot antenna 242 within the processing container 230. The raw material gas supplying structure 260 is formed in a circular shape of which the external form is larger than at least the diameter of the wafer W in the planar view. By this raw material gas supplying structure 260, the interior of the processing container 230 is divided into a plasma generating region R1 at the radial line slot antenna 242 side and a raw material gas dissociating region R2 at the mounting table 231 side. Also, the raw material gas supply structure 260 is formed of, for example, alumina. In such a case, the raw material gas supplying structure 260 is resistant to nitrogen trifluoride gas used for dry cleaning. Further, in order to further improve the resistance to the nitrogen trifluoride gas, the alumina surface of the raw material gas supplying structure 260 may be coated with yttrium oxide.

Figure 7:
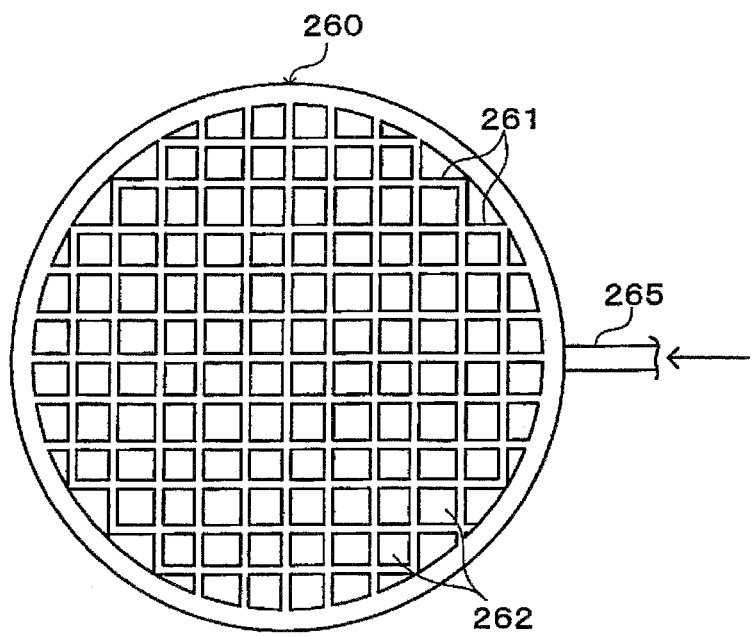
FIG. 7 is a plan view of a raw material gas supplying structure.
Figure 8:
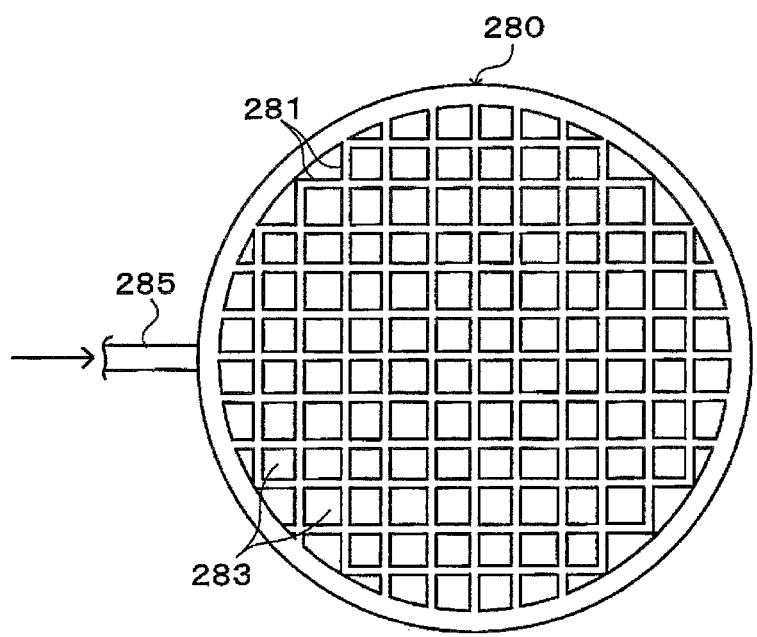
FIG. 8 is a plan view of a plasma excitation gas supplying structure.

As illustrated in FIG. 7, the raw material gas supplying structure 260 is configured by a series of raw material gas supplying pipes 261 substantially disposed in a lattice form on the same plane. The longitudinal section of the raw material gas supplying structures 260 is formed in a rectangular shape when viewed in the axial direction. In a gap between adjacent raw material gas supplying pipes 261, a plurality of openings 262 are formed. The plasma and radicals generated in the plasma generating region R1 at the top side of the raw material gas supplying structure 260 pass through the openings 262 and may enter into the raw material gas dissociating region R2 at the mounting table 231 side.

In the bottom surface of the raw material gas supplying pipes 261 of the raw material gas supplying structure 260, a large number of raw material gas supplying openings 263 are formed, as illustrated in FIG. 6. The raw material gas supplying openings 263 are arranged evenly in the in-plane of the raw material gas supplying structure 260. The raw material gas supplying pipes 261 are connected with a gas pipe 265 communicating with a raw material gas supplying source 264 provided outside of the processing container 230. In the raw material gas supplying source 264, for example, silane ($SiH_4$) gas and hydrogen ($H_2$) gas are individually enclosed as raw material gases. The gas pipe 265 is provided with a valve 266 and a mass flow controller 267. By such a configuration, the silane gas and the hydrogen gas with a predetermined flow rate are respectively introduced to the raw material gas supplying pipes 261 via the gas pipe 265 from the raw material gas supplying source 264. Also, the silane gas and the hydrogen gas are supplied from each of the raw material gas supplying openings 263 toward the raw material gas dissociating region R2.

On the inner circumferential surface of the processing container 230 covering the outer circumferential surface of the plasma generating region R1, first plasma excitation gas supplying openings 270 are formed. The first plasma excitation gas supplying openings 270 are formed at plural portions along the inner circumferential surface of the processing container 230. The first plasma excitation gas supplying openings 270 are connected with, for example, first plasma excitation gas supplying pipes 272 which penetrate the side wall of the processing container 230 and communicate with a first plasma excitation gas supplying source 271 provided outside of the processing container 230. Each of the first plasma excitation gas supplying pipes 272 is provided with a valve 273 and a mass flow controller 274. By such a configuration, plasma excitation gas with a predetermined flow rate may be supplied from the lateral side into the plasma generating region R1 within the processing container 230. In the present exemplary embodiment, for example, argon (Ar) gas is enclosed in the first plasma excitation gas supplying source 271 as plasma excitation gas.

On the top surface of the raw material gas supplying structure 260, for example, a plasma excitation gas supplying structure 280 which is in a substantially flat plate shape and has the same configuration as that of the raw material gas supplying structure 260 is stacked. As illustrated in FIG. 3, the plasma excitation gas supplying structure 280 is configured by second plasma excitation gas supplying pipes 281 arranged in a lattice form. Also, the plasma excitation gas supplying structure 280 is formed of, for example, alumina. In such a case, the plasma excitation gas supplying structure 280 is resistant to nitrogen trifluoride gas used for dry cleaning. Further, in order to further improve the resistance to the nitrogen trifluoride gas, the alumina surface of the plasma excitation gas supplying structure 280 may be coated with yttrium oxide.

As illustrated in FIG. 6, a plurality of second plasma excitation gas supplying openings 282 are formed on the top surface of the second plasma excitation gas supplying pipes 281. The plurality of second plasma excitation gas supplying openings 282 are evenly arranged on the surface of the plasma excitation gas supplying structure 280. Accordingly, the plasma excitation gas may be supplied from the lower side in relation to the plasma generating region R1 towards the top side. Also, in the present exemplary embodiment, the plasma excitation gas is, for example, argon gas. Further, in addition to the argon gas, nitrogen ($N_2$) gas which is a raw material gas is supplied to the plasma generating region R1 from the plasma excitation gas supplying structure 280.

Openings 283 are formed at gaps between adjacent second plasma excitation gas supplying pipes 281 in a lattice form. The plasma and radicals generated in the plasma generating region R1 may penetrate the plasma excitation gas supplying structure 280 and the raw material gas supplying structure 260 and enter into the raw material gas dissociating region R2 of lower side.

A gas pipe 285 is connected to the second plasma excitation gas supplying pipes 281, in which the gas pipe 285 communicates with a second plasma excitation gas supplying source 284 provided outside of the processing container 230. In the second plasma excitation gas supplying source 284, for example, argon gas which is a plasma excitation gas and nitrogen gas which is a raw material gas are individually enclosed. The gas pipe 285 is provided with a valve 286 and a mass flow controller 287. By such a configuration, the nitrogen gas and the argon gas with a predetermined flow rate may be respectively supplied from the second plasma excitation gas supplying openings 282 to the plasma generating region R1.

Also, the above-described raw material gas and plasma excitation gas constitute the processing gas of the present invention.

Exhaust ports 290 configured to exhaust the atmosphere within the processing container 230 are formed on opposite sides between which the mounting table 231 of the bottom portion of the processing container 230 is interposed. Exhaust pipes 292 are connected to the exhausts 290 in which the exhaust pipes communicate with exhausting devices 291 such as a turbo molecular pump. By exhausting from the exhaust ports 290, the interior of the processing container 230 may be maintained at a predetermined pressure of, for example, 20 Pa to 40 Pa as will be described later.

The above-described substrate processing system 1 is provided with a control unit 300 as illustrated in FIG. 1. The control unit 300 is, for example, a computer and has a program storage unit (not illustrated). In the program storage unit, a program executing a wafer processing in the substrate processing system 1 is stored. Also, the program is recorded on a computer-readable storage medium such as a hard disk ("HD"), a flexible disk ("FD"), a compact disk ("CD"), a magnet optical disk ("MO"), and a memory card which are computer-readable and may be installed in the control unit 300 from the storage medium.

Figure 9:
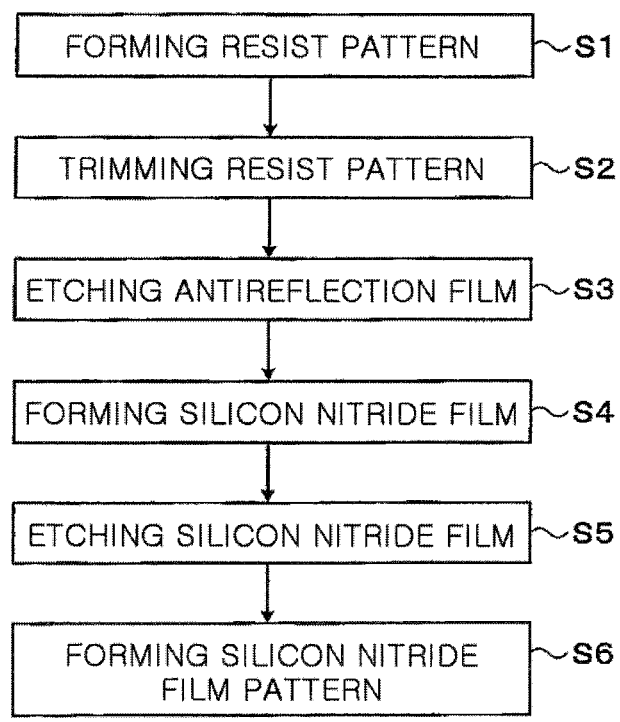
FIG. 9 is a flow chart illustrating each wafer processing step.
Figure 10A:
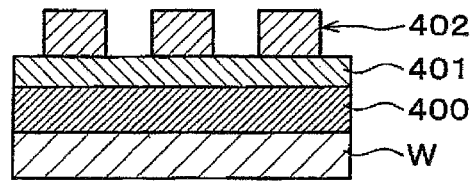
FIGS. 10A to 10D are explanatory views schematically illustrating a state of a wafer in each step of the wafer processing.

Next, the wafer processing performed in the substrate processing system 1 configured as above will be described. FIG. 9 is a flow chart illustrating main processes of the wafer processing. FIGS. 10A to 10D schematically illustrate a state of the wafer in each wafer processing step. Also, as illustrated in FIG. 10A, a film to be processed 400 is formed in advance on a wafer W processed in the substrate processing system. The film to be processed 400 is, for example, a polysilicon film as described above.

The wafer W is conveyed to the coating/developing processing apparatus 20 of the first processing unit 11 first. In the coating/developing processing apparatus 20, one wafer W is taken out from the inside of a cassette C on the cassette mounting table 40 by the wafer conveyance device 51 and conveyed to, for example, a transfer device 83 of the third block G3 of the processing station 31.

Next, the wafer W is conveyed to the heat treatment device 70 of the second block G2 by the wafer conveyance device 100 and is subjected to temperature adjustment. Then, the wafer W is conveyed to the antireflection film forming device 61 of the first block G1 by the wafer conveyance device 100 and an antireflection film 401 is formed on the wafer W as illustrated in FIG. 10A. Then, the wafer W is conveyed to the heat treatment device 70 of the second block G2, subjected to temperature adjustment and then returned to the transfer device 83 of the third block G3.

Next, the wafer W is conveyed to the transfer device 84 of the same third block G3 by the wafer conveyance device 120. Then, the wafer W is conveyed to an adhesion device 71 of the second block G2 by the wafer conveyance device 100 and subjected to an adhesion processing.

Thereafter, the wafer W is conveyed to the resist application device 62 by the wafer conveyance device 100 and the resist liquid is applied to the rotating wafer W to form a resist film on the wafer W. Then, the wafer W is conveyed to a heat treatment device 70 by the wafer conveyance device 100 and subjected to a pre-bake processing.

Next, the wafer W is conveyed to a peripheral exposure device 72 by the wafer conveyance device 100 and the exposure processing is performed on the outer circumference portion of the wafer W. Then, the wafer W is conveyed to the transfer device 86 of the third block G3 by the wafer conveyance device 100.

Next, the wafer W is conveyed to the transfer device 82 by the wafer conveyance device 120 and conveyed to the transfer device 92 of the fourth block G4 by the shuttle conveyance device 110.

Then, the wafer W is conveyed to the exposure device 21 by the wafer conveyance device 130 of the interface station 32 and subjected to the exposure processing.

Next, the wafer W is conveyed to the transfer device 90 of the fourth block G4 from the exposure device 21 by the wafer conveyance device 130. Then, the wafer W is conveyed to the heat treatment device 70 of the second block G2 by the wafer conveyance device 100, exposed and then subjected to the bake processing. Then, the wafer W is conveyed to the developing device 60 by the wafer conveyance device 100, and developed. After the development is ended, the wafer W is conveyed to a heat treatment device 70 by the wafer conveyance device 100 and subjected to a post-bake processing.

Then, the wafer W is conveyed to the transfer device 80 of the third block G3 by the wafer conveyance device 100, and then to a cassette C of a predetermined cassette mounting section 41. In this manner, a series of photolithography processings are ended. As illustrated in FIG. 10A, a resist pattern 402 is formed on the wafer W (step S1 of FIG. 9).

When the resist pattern 402 is formed on the wafer W in the first processing unit 11, the cassette C which accommodates the wafer W is carried out from the coating/developing processing apparatus 20 and subsequently conveyed to the second processing unit 12.

In the second processing unit 12, one wafer W is taken out from a cassette C on the cassette mounting table 212 and conveyed into the load-lock device 213a by the wafer conveyance mechanism 210. When the wafer W is carried into the load-lock device 213a, the interior of the load-lock device 213a is sealed and depressurized. Then, the interior of the load-lock device 213a and the interior of the conveyance room chamber 214 in the depressurized state in relation to the atmospheric pressure (for example, substantially a vacuum state) communicate with each other. Then, the wafer W is carried out from the load-lock device 213a and carried into the conveyance room chamber 214 by the wafer conveyance mechanism 215.

Figure 10B:
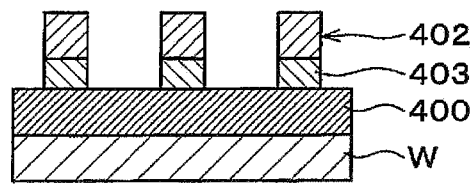

The wafer W conveyed into the conveyance room chamber 214 is subsequently conveyed to the etching device 202 by the wafer conveyance mechanism 215. In the etching device 202, as illustrated in FIG. 10B, the resist pattern 402 on the wafer W is trimmed and the linewidth thereof is narrowed (step S2 in FIG. 9). Also, at the same time, the antireflection film 401 on the wafer W is etched using the trimmed resist pattern 402 as a mask. Then, a pattern 403 of the antireflection film 401 (hereinafter, which may be referred to as an "antireflection film pattern 403") is formed on the film to be processed 400 (step S3 in FIG. 9). Further, the trimming of the resist pattern 402 and etching of the antireflection film 401 may be performed by plasma etching using, for example, oxygen plasma. Furthermore, the resist pattern 402 and the antireflection film pattern 403 constitute the pattern of the organic film of the present invention.

Figure 10C:
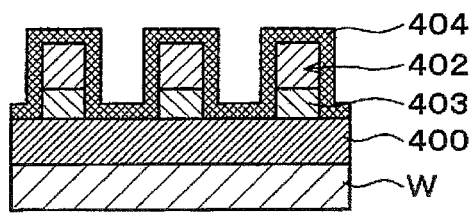

Then, the wafer W is returned to the conveyance room chamber 214 by the wafer conveyance mechanism 215 and subsequently conveyed to the plasma film forming device 203. In the plasma film forming device 203, as illustrated in FIG. 10C, a silicon nitride film 404 is formed on the resist pattern 402 for example, by CVD method (step S4 in FIG. 9). The method of forming the silicon nitride film 404 in the plasma film forming device 203 will be described in detail later.

Figure 10D:
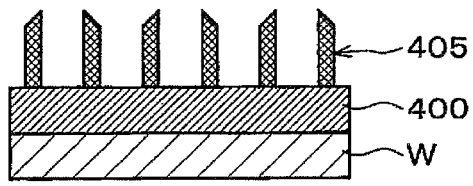

Then, the wafer W is returned to the conveyance room chamber 214 by the wafer conveyance mechanism 215 and subsequently conveyed to the etching device 204. In the etching device 204, as illustrated in FIG. 10D, the silicon nitride film 404 is etched such that the silicon nitride film 404 remains only on the lateral wall sections of the resist pattern 402 and antireflection film pattern 403 (step S5 in FIG. 9). Also, the etching is performed using, for example, a mixed gas of a CF-based gas such as $CF_4$, $C_4F_8$, $CHF_3$, $CH_3F$, or $CH_2F_2$ and a gas such as Ar gas, or a gas in which oxygen is added to the mixed gas as desired.

Then, the wafer W is returned to the conveyance room chamber 214 by the wafer conveyance mechanism 215 and subsequently conveyed to the ashing device 205. In the ashing device 205, as illustrated in FIG. 10D, the resist pattern 402 and the antireflection film pattern 403 are removed by ashing using, for example, oxygen plasma. Then, a pattern 405 of the silicon nitride film 404 (hereafter, which may be referred to as a "silicon nitride film pattern 405") is formed on the film to be processed 400 (step S6 of FIG. 9).

Then, the wafer W is returned to the conveyance room chamber 214 by the wafer conveyance mechanism 215 and subsequently conveyed to the load-lock device 213b. Then, the wafer W is accommodated in a predetermined cassette C by the wafer conveyance mechanism 210, the cassette C accommodating the wafer W is carried out from the second processing unit 12, and a series of wafer processings are ended.

Next, the film-forming method of the silicon nitride film 404 performed in the plasma film forming device 203 in step S4 as described above will be described.

First, for example, when the plasma film forming device 203 is started up, the supply flow rate of argon gas supplied from the first plasma excitation gas supplying opening 270 and the supply flow rate of argon gas supplied from the second plasma excitation gas supplying opening 282 are adjusted such that the concentration of argon gas supplied within the plasma generating region R1 becomes uniform. When adjusting the supply flow rate, argon gas set to a proper supply flow rate is supplied from each of the plasma excitation gas supply openings 270, 282 in a state in which gas stream which is the same as that at the time of actual film-forming is formed within the processing container 230 by operating, for example, the exhausting devices 291. Then, with the setting of the supply flow rate, film forming is actually performed on a test wafer and inspection as to whether or not the film forming has been performed uniformly on the surface of the wafer or not is performed. When the concentration of argon gas within the plasmas generating region R1 is uniform, the film forming on the surface of the wafer is performed uniformly. Therefore, when the film forming has not been performed uniformly on the surface of the wafer as a result of the inspection, each setting of supply flow rate of argon gas is changed and filming forming is performed again on a test wafer. This is repeated and the supply flow rate from the each of the plasma excitation gas supplying openings 270, 282 is set such that the film forming on the surface of the wafer is performed uniformly and the concentration of argon gas within the plasma generating region R1 becomes uniform.

After the supply flow rate of each of the plasma excitation gas supplying openings 270, 282 is set as described above, the filming forming processing of a wafer W in the plasma film forming device 203 is started. First, the wafer W is conveyed into the processing container 230 and adsorbed to and maintained on the mounting table 231. At this time, the temperature of the wafer W is maintained at no more than 100° C., for example, between 50° C. and 100° C. Subsequently, the exhaust of the interior of the processing container 230 is started by the exhausting devices 291 and the pressure within the processing container 230 is reduced to a predetermined pressure of, for example, 20 Pa to 40 Pa and the state is maintained.

Here, as a result of inventors' keen examination, it has been found out that, when the pressure within the processing container 230 is lower than 20 Pa, ion energy becomes large so that the silicon nitride film may not be formed properly on the wafer W. Thus, the pressure within the processing container 230 is maintained at 20 Pa to 40 Pa.

When the interior of the processing container 230 is decompressurized, argon gas is supplied into the plasma generating region R1 from the first plasma excitation gas supplying openings 270 at the lateral sides and nitrogen gas and argon gas are supplied from the second plasma excitation gas supplying openings 282 at the lower side. At this time, the concentration of argon gas within the plasma generating region R1 is maintained uniformly. Also, the nitrogen gas is supplied at the flow rate of, for example, 64 sccm. A microwave of, for example, a power of 2.5 kW to 3.0 kW and a frequency of 2.45 GHz is radiated from the radial line slot antenna 242 towards the plasma generating region R1 just below the radial line slot antenna 242. By this microwave radiation, the argon gas within the plasma generating region R1 is turned into plasma and the nitrogen gas is turned into (or ionized). Also, at this time, the microwave proceeding downwards is reflected at the plasma excitation gas supplying structure 280 and stays within the plasma generating region R1. As a result, high-density plasma is generated within the plasma generating region R1.

The plasma and radicals generated within the plasma generating region R1 pass through the plasma excitation gas supplying structure 280 and the raw material gas supplying structure 260 and enter into the raw material gas dissociating region R2 at the lower side. In the raw material gas dissociating region R2, silane gas and hydrogen gas are supplied from each of the raw material gas supplying openings 263 of the raw material gas supplying structure 260. At this time, the silane gas is supplied at the flow rate of, for example, 18 sccm and the hydrogen gas is supplied at the flow rate of, for example, 21 sccm. Also, the supply flow rate of this hydrogen gas is set according to the film characteristic of the silicon nitride film 404 as will be described later. The silane gas and the hydrogen gas area are dissociated by plasma particles each entering from the upper side. By these radicals and the radicals of the nitrogen gas supplied from the plasma generating region R1, the silicon nitride film 404 is deposited on the wafer W.

Then, when the film forming of silicon nitride film 404 is performed and the silicon nitride film 404 with a predetermined thickness is formed on the wafer W, the radiation of the microwave and the supply of processing gas are stopped. Then, the wafer W is carried out from the processing container 230 and a series of plasma film forming processings are ended. In this manner, the silicon nitride film 404 with low stress of no more than 100 Mpa is formed on the wafer W.

Here, as a result of inventors' keen examination, it has been found out that the film characteristic is enhanced if processing gas containing silane gas, nitrogen gas, and hydrogen gas is used when the silicon nitride film 404 is formed on the wafer W by the above-described plasma film forming processings.

Figure 11:
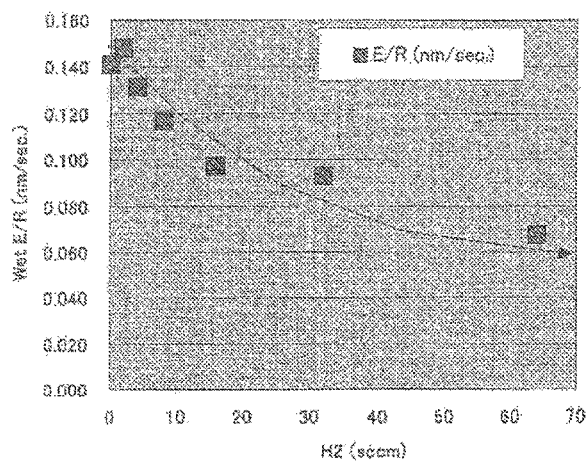
FIG. 11 is a graph illustrating a relationship between a supply flow rate of hydrogen gas and a wet etching rate of the silicon nitride film when a plasma film-forming method according to the present exemplary embodiment is used.

FIG. 11 illustrates an aspect in which the wet etching rate of the silicon nitride film 404 in relation to hydrofluoric acid changes when the supply flow rate of the hydrogen gas in the processing gas is varied using the film-forming method of the above-described exemplary embodiment. Also, at this time, the supply flow rate of the silane gas is 18 sccm and the supply flow rate of the hydrogen gas is 21 sccm. Further, during the plasma film forming processings, the temperature of the wafer W is 100° C.

Referring to FIG. 11, it has been found out that the wet etching rate of the silicon nitride film 404 in relation to the hydrofluoric acid decreases when hydrogen gas is further added to the processing gas including silane gas and nitrogen gas. Therefore, the hydrogen gas in the processing gas enhances the density of the silicon nitride film 404 and the quality of the silicon nitride film 404 is enhanced. Also, the step coverage of the silicon nitride film 404 is enhanced. Further, it has been found out that the refractive index of the silicon nitride film 404 is enhanced to, for example, 2.0±0.1. Furthermore, as the supply flow rate of the hydrogen gas increases, the wet etching rate of the silicon nitride film 404 in relation to the hydrofluoric acid decreases. Therefore, when the supply flow rate of the hydrogen gas is controlled, the wet etching rate of the silicon nitride film 404 may be controlled. Consequently, the film characteristic of the silicon nitride film 404 may be controlled.

Figure 12:
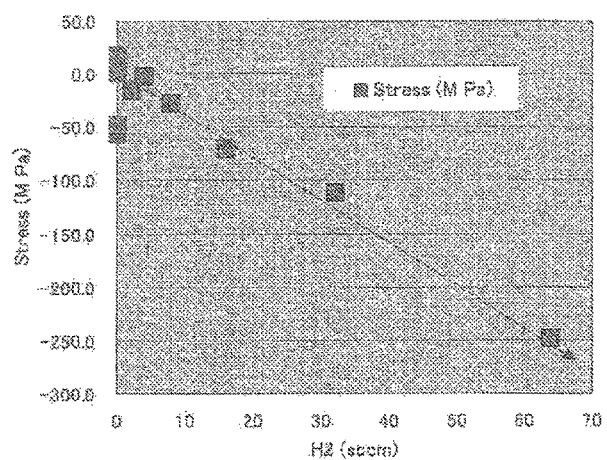
FIG. 12 is a graph illustrating a relationship between a supply flow rate of hydrogen gas and a film stress of the silicon nitride film when the plasma film-forming method according to the present exemplary embodiment is used.

FIG. 12 illustrates an aspect in which the film stress of the silicon nitride film 404 changes when the supply flow rate of the hydrogen gas in the processing gas is varied using the plasma film forming method of the above-described exemplary embodiment. Also, at this time, the supply flow rate of the silane gas was 18 sccm and the supply flow rate of the hydrogen gas was 21 sccm. Further, during the plasma film forming processings, the temperature of the wafer W was 100° C.

Referring to FIG. 12, it has been found out that the film stress of the silicon nitride film 404 changes towards the minus side (compression side) when hydrogen gas is further added to the processing gas including silane gas and nitrogen gas. Moreover, as the supply flow rate of the hydrogen gas increases, the film stress of the silicon nitride film 404 decreases. Therefore, when the supply flow rate of the hydrogen gas is controlled, the film stress of the silicon nitride film 404 may be controlled to no more than 100 MPa and the film characteristic of the silicon nitride film 404 may be controlled. Also, the lower limit value of the film stress is not particularly limited and the film stress may be more than 0 Mpa and no more than 100 Mpa.

As described above, according to the present exemplary embodiment, since the silicon nitride film 404 is formed in a state in which the temperature of the wafer W in step S4 is maintained at a low temperature of no more than 100° C., it is avoidable that the resist pattern 402 and the antireflection film pattern 403 get damaged. Also, since the silicon nitride film 404 has low stress of no more than 100 MPa, the resist pattern 402 and the antireflection film pattern 403 are not deformed in step S5. Further, even after the resist pattern 402 and the antireflection film pattern 403 are removed in step S6, the silicon nitride film 404 maintains a predetermined form. Therefore, the silicon nitride film 404 which serves as a mask when the film to be processed 400 on the wafer W is etched may be properly formed in a predetermined pattern.

Further, according to the present exemplary embodiment, when the supply flow rate of the hydrogen is controlled, the film characteristic such as the wet etching rate or the film stress may be controlled.

Figure 13:
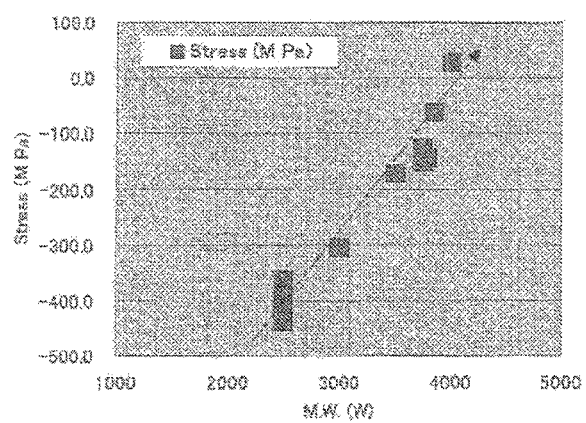
FIG. 13 is a graph illustrating a relationship between a power of a microwave and the film stress of the silicon nitride film when the plasma film-forming method according to the present exemplary embodiment is used.

Furthermore, the present exemplary embodiment generates plasma using the microwave radiated from the radial line slot antenna 242. Here, as a result of inventors' keen examination, it has been found out that the power of the microwave and the film stress of the silicon nitride film 404 are in a substantially proportional relationship as illustrated in FIG. 13 when the processing gas contains silane gas, nitrogen gas, and hydrogen gas. Therefore, according to the present exemplary embodiment, when the power of the microwave is controlled, the film stress of the silicon nitride film 404 may be controlled.

Here, in the related art, there were cases in which a batch type film-forming processing of a silicon nitride film 404 is performed using an atomic layer deposition ("ALD") method.

When the ALD method is applied to the substrate processing system 1 of the present exemplary embodiment, first, it is required to carry out a wafer W from the substrate processing system 1 in order to form the silicon nitride film 404 on the wafer W. Thus, the throughput of processing wafers decreases. In comparison, in the present exemplary embodiment, the plasma film forming device 203 is disposed within the second processing unit 12 of the substrate processing system 1 and the plasma film forming device 203 performs a single wafer film forming processing using the CVD method. Therefore, according to the present exemplary embodiment, the throughput of processing wafers may be enhanced.

In the plasma film forming device 203 of the above-described exemplary embodiment, although the silane gas and the hydrogen gas are supplied from the raw material gas supplying structure 260 and the nitrogen gas and the argon gas are supplied from the plasma excitation gas supplying structure 280, the hydrogen gas may be supplied from the plasma excitation gas supplying structure 280. Alternatively, the hydrogen gas may be supplied from both of the raw material gas supplying structure 260 and the plasma excitation gas supplying structure 280. In any cases, when the supply flow rate of the hydrogen gas is controlled as described above, the film characteristic of the silicon nitride film 404 may be controlled.

Also, in the above-described exemplary embodiment, although the hydrogen gas in the processing gas is controlled to control the film stress of the silicon nitride film 404, the control method of the film stress is not limited to the present exemplary embodiment. As a result of inventors' keen examination, for example, when the ratio between the supply flow rate of the silane gas and the supply flow rate of the nitrogen gas is controlled, the film stress of the silicon nitride film 404 may be controlled.

Further, in the above-described exemplary embodiment, although the processing gas includes the nitrogen gas, it is not limited thereto as long as the gas includes nitrogen atoms. For example, the processing gas may contain ammonia ($NH_3$) gas.

Furthermore, in the plasma film forming device 203 of the above-described exemplary embodiment, although the plasma is generated by the microwave from the radial line slot antenna 242, the generation of the plasma is not limited to the present exemplary embodiment. As for the plasma, for example, a capacitively coupled plasma (CCP), an inductively coupled plasma (ICP), an electron cyclotron resonance plasma (ECRP), or a helicon wave plasma (HWP) may be used. In any cases, since the film forming of the silicon nitride film 404 is performed under the low temperature environment of not more than 100° C., it is preferable to use high-density plasma.

Also, in the above-describe exemplary embodiment, although the silicon nitride film 404 is used as a mask when etching the film to be processed 400, for example, a silicon oxynitride film (SiON film) may be used. In such a case, oxygen gas is added to the processing gas in addition to the above-described silane gas, nitrogen gas, and hydrogen gas. As a result of the inventors' keen examination, it has been confirmed that above-described effects may be obtained even if the present invention is applied to a silicon oxynitride film.

Although the cases in which a polysilicon film is used as a film to be processed 400 is described in the above-described exemplary embodiment, other films such as an amorphous silicon film, a silicon oxide film ($SiO_2$ film), and a tetraethyl orthosilicate film (TEOS film) may be used. The silicon nitride film 404 has a high selection ratio in relation to the film to be processed 400 as compared to the conventionally used silicon oxide film. Therefore, when the silicon nitride film 404 is used as a mask, the application range of the etchable film to be processed 400 becomes broad.

Figure 14A:
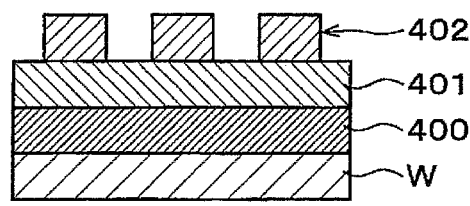
FIGS. 14A to 14D are explanatory views illustrating a state of the wafer in each wafer processing step according to another exemplary embodiment.
Figure 14B:
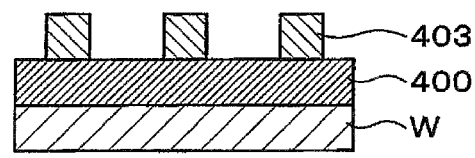
Figure 14C:
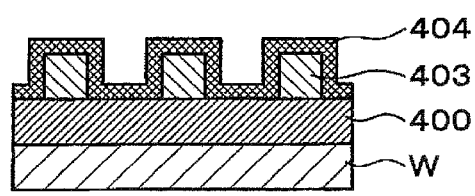
Figure 14D:
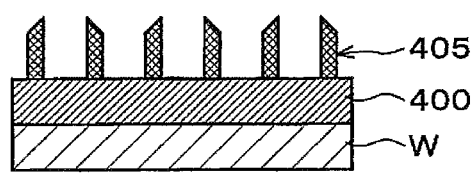

Also, in the above-described exemplary embodiment, although the resist pattern 402 and the antireflection film pattern 403 are removed in step S6, the resist pattern 402 may be removed after step S3. That is, after the resist pattern 402 is formed on the wafer W (step S1 of FIG. 9) as illustrated in FIG. 14A, the resist pattern 402 is trimmed (step S2 of FIG. 9) and the antireflection film 401 is etched (step S3 of FIG. 9). Thereafter, the resist pattern 402 is removed as illustrated in FIG. 14B and the antireflection film pattern 403 is formed on the film to be processed 400 on the wafer W as the pattern of the organic film. Then, the silicon nitride film 404 is formed on the antireflection film 403 (step S4 of FIG. 9) as illustrated in FIG. 14C. Then, silicon nitride film 404 is etched (step S5 of FIG. 9) and the antireflection film pattern 403 is removed (step S6 of FIG. 9) as illustrated in FIG. 14D. Also, in the present exemplary embodiment, the silicon nitride film pattern 405 may be properly formed on the film to be processed 400. Further, since these processes S1 to S6 are the same as those of the above-described exemplary embodiment, detailed descriptions thereof will be omitted.

Figure 15:
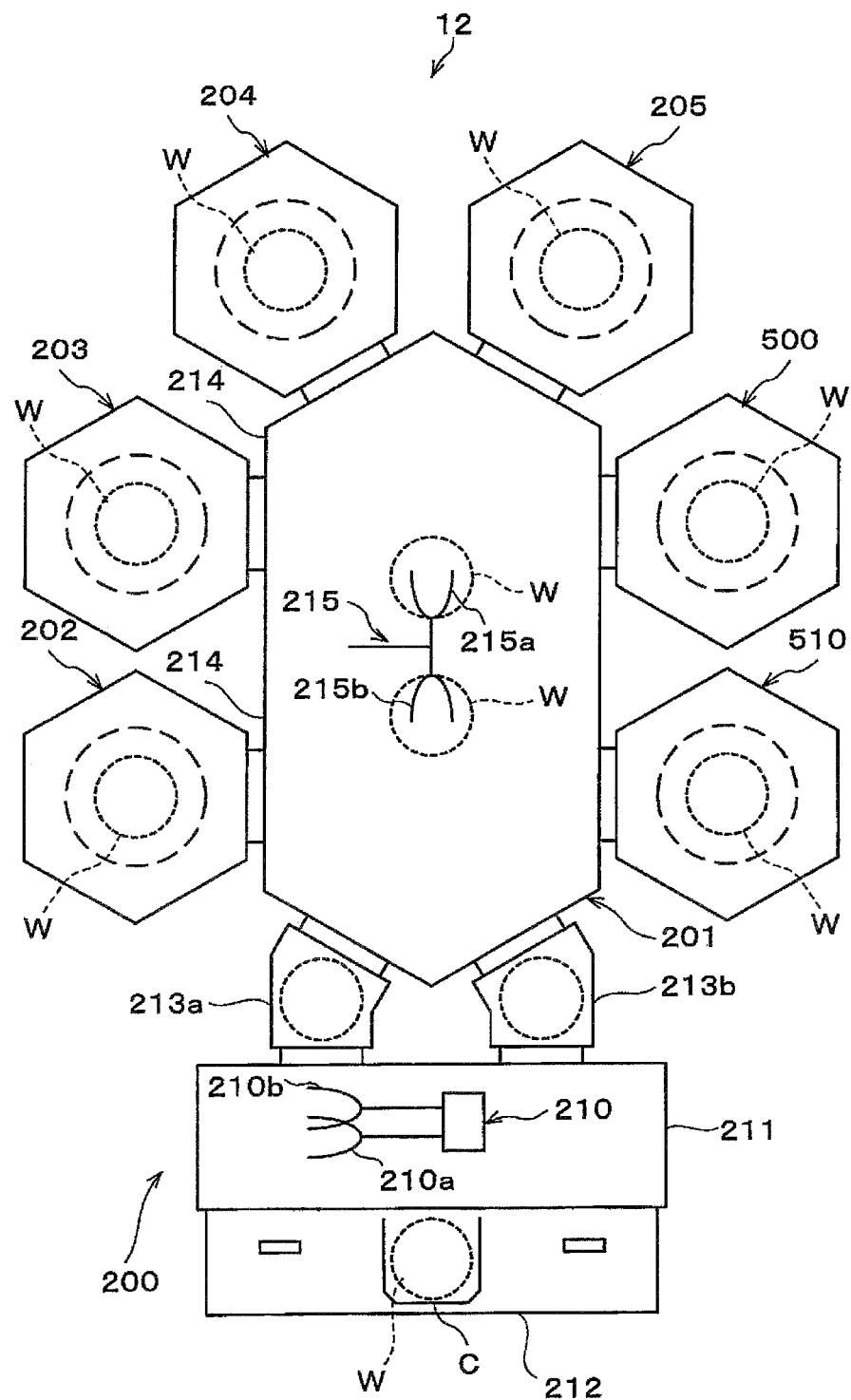
FIG. 15 is a plan view schematically illustrating a configuration of a second processing unit according to another exemplary embodiment.

In the above-described exemplary embodiment, the dimension of the silicon nitride film pattern 405 may be measured after step S6. In such a case, for example, as illustrated in FIG. 15, a dimension measuring device 500 is disposed in the second processing unit 12. The dimension measuring device 500 is disposed, for example, outside of the conveyance room chamber 214 of the common conveyance unit 201 and next to the ashing device 205 in the clockwise direction in the plan view. In the illustrated example, an etching device 510 to be described later is also disposed in the second processing unit 12. Also, the dimension measuring device 500 is not limited to the present exemplary embodiment and the dimension measuring device 500 may be disposed at an arbitrary position. For example, the dimension measuring device 500 may be disposed adjacent to the conveyance room 211. In such a case, in the dimension measuring device 500, the dimension of the silicon nitride film pattern 405 is measured in the air atmosphere.

The dimension measuring device 500 measures the dimension of the silicon nitride film pattern 405 using, for example, a scatterometry method. The scatterometry method is a method in which an in-plane light intensity distribution of a wafer W detected by irradiating light to the silicon nitride film pattern 405 on the wafer W is matched with a virtual light intensity distribution stored in advance and the dimension of a virtual silicon nitride film pattern of which the light intensity distribution is proper is estimated as the dimension of the actual silicon nitride film pattern 405. Also, in the present exemplary embodiment, as the dimension of the silicon nitride film pattern 405, for example, the linewidth of the silicon nitride film pattern 405 is measured. However, another dimension such as the height of the silicon nitride film pattern 405 may be measured.

In such a case, the wafer W formed with the silicon nitride film pattern 405 in step S6 is conveyed to the dimension measuring device 500 by the wafer conveyance mechanism 215. The dimension measuring device 500 measures the linewidth of the silicon nitride film pattern 405 by the above-described scatterometry method.

A result of the dimension measuring device 500 is output, for example, to the control unit 300. In the control unit 300, when the measured linewidth of the silicon nitride film pattern 405 is not a desired linewidth, for example, a processing condition of film-forming processing in the plasma film forming device 203 is corrected based on the measured result. Specifically, for example, the supply flow rate of the nitrogen gas, the temperature of the wafer W under processing, and the pressure of the processing container 230 are corrected. In this manner, the processing condition of the plasma film forming device 203 is feedback-controlled and a subsequent wafer W is processed using the processing conditions after correction. Therefore, a silicon nitride film pattern 405 with a predetermined linewidth may be formed on the wafer W. Also, the yield of the products of semiconductor devices may be improved.

Also, in the above-described exemplary embodiment, the processing conditions of the plasma film forming device 203 are corrected based on the measured results of the dimensions of the silicon nitride pattern film 405 in the dimension measuring device 500. However, the processing conditions of each processing device of the etching devices 202, 204, the ashing device 205, the first processing unit 11 may be corrected.

Further, in the above-described exemplary embodiment, although the dimensions of the silicon nitride film pattern 405 are measured in the dimension measuring device 500, the dimensions of the resist pattern 402 after trimming in step S2 (or the dimension of the etched antireflection film pattern 403 in step S3) may be measured. Also, in the present exemplary embodiment, for example, the linewidth of the resist pattern 402 is measured as a dimension of the resist pattern 402. However, another dimension such as the height of the resist pattern 402 may be measured.

After the linewidth of the resist pattern 402 is measured in the dimension measuring device 500, the control unit 300 corrects the processing conditions of each processing device of the etching device 202 and the first processing unit 11 based on the measured results. In such a case, since these processing conditions are also feedback-controlled, a subsequent wafer W may be properly processed using the processing conditions after correction. The descriptions on the measuring method of the resist pattern 402 in the dimension measuring device 500 will be omitted since it is the same as the dimension measuring method of the silicon nitride film pattern 405.

As described in the above exemplary embodiment, after the silicon nitride film pattern 405 is formed on the film to be processed 400 on the wafer W, the film to be processed 400 is etched using the silicon nitride film pattern 405 as a mask.

In such a case, the etching of the film to be processed 400 is performed, for example, in the etching device 510 as illustrated in FIG. 15. The etching device 510 is disposed, for example, in the second processing unit 12 of the substrate processing system 1. Specifically, the etching device 510 is disposed, for example, outside of the conveyance room chamber 201 of the common conveyance unit 201 and next to the dimension measuring device 500 in the clockwise direction in the plan view. Also, for the etching device 510, conventional devices may be used and the descriptions on the configuration thereof will be omitted.

Figure 16:
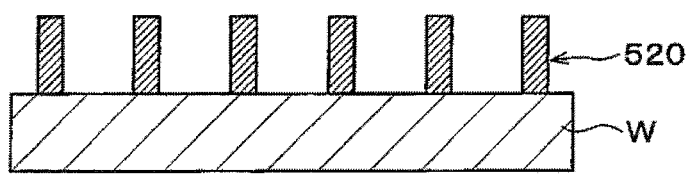
FIG. 16 is an explanatory view illustrating an aspect in which a pattern of a film to be processed is formed on the wafer.

Then, the wafer W formed with the silicon nitride film pattern 405 is conveyed to the etching device 510 by the wafer conveyance mechanism 215. In the etching device 510, the film to be processed 400 is etched having the silicon nitride film pattern 405 as a mask and a pattern 520 of the film to be processed 400 (hereafter, it may be referred to as "film to be processed pattern 520") is formed on the wafer W as illustrated in FIG. 16. Such etching is performed using, for example, HBr gas. Thus, a semiconductor device is manufactured.

According to the present exemplary embodiment, since the silicon nitride film pattern 405 is properly formed on the wafer W, the film to be processed pattern 520 may also be properly formed on the wafer W. Therefore, the yield of semiconductor devices may be improved.

Also, in the present exemplary embodiment, although the etching device 510 is disposed within the substrate processing system 1, it may be disposed outside of the substrate processing system 1.

Although preferred exemplary embodiments of the present invention have been described above with reference to the accompanying, the present invention is not limited to such examples. Since it is apparent that a person skilled in the art may conceive various modified examples or changed examples within the scope of the spirit defined in the claims, it shall be noted that the modified examples or changed examples naturally belong to the technical scope of the present invention. The present invention is not limited to the examples and may employ various aspects. The present invention may be applied to a different substrate such as a glass substrate for a flat panel display (FPD) or a mask reticle for a photo mask other than the semiconductor wafer.

1: substrate processing system
11: first processing unit
12: second processing unit
20: coating/developing processing apparatus
21: exposure device
202: etching device
203: plasma film forming device
204: etching device
205: ashing device
242: radial line slot antenna
260: raw material gas supplying structure
263: raw material gas supplying openings
270: first plasma excitation gas supplying opening
280: plasma excitation gas supplying structure
282: second plasma excitation gas supplying openings
290: exhaust
300: control unit
400: film to be processed ("processed film")
401: antireflection film
402: resist pattern
403: antireflection film pattern
404: silicon nitride film
405: silicon nitride film pattern
500: dimension measuring device
510: etching device
520: film to be processed pattern
R1: plasma generating region
R2: raw material gas dissociating region
W: wafer

What is claimed is:

1. A method of forming a pattern which serves as a mask when etching a film to be processed on a substrate, the method comprising:

forming a pattern of an organic film on the film to be processed of the substrate;

forming a silicon nitride film on the pattern of the organic film;

etching the silicon nitride film such that the silicon nitride film remains only on a lateral wall section of the pattern of the organic film; and removing the pattern of the organic film, thereby forming a pattern of the silicon nitride film on the film to be processed on the substrate, wherein when forming the silicon nitride film, a processing gas is excited to generate plasma and a plasma processing by the plasma is performed in a state where the temperature of the substrate is maintained at a temperature of 100° C. or less, thereby forming a silicon nitride film having a film stress of 100 MPa or less.

2. The method of claim 1, wherein the processing gas includes silane gas, a gas having a nitrogen atom, and hydrogen gas, and when forming the silicon nitride film, a supply flow rate of the hydrogen gas is controlled to control the film stress of the silicon nitride film.

3. The method of claim 1, wherein the processing gas includes silane gas and a nitrogen atom containing gas, and when forming the silicon nitride film, a ratio between a supply flow rate of the silane gas and a supply flow rate of the nitrogen atom containing gas is controlled to control the film stress of the silicon nitride film.

4. The method of claim 1, wherein, when forming the silicon nitride film, a processing atmosphere is maintained to 20 Pa to 40 Pa.

5. The method of claim 1, wherein, when forming the silicon nitride film, the processing gas is excited by a microwave to generate the plasma.

6. The method of claim 1, wherein, after the pattern of the silicon nitride film is formed, a dimension of the pattern of the silicon nitride film is measured and a processing condition when forming the silicon nitride film is corrected based on this measured result.

7. The method of claim 1, wherein, after the pattern of the organic film is formed, a dimension of the pattern of the organic film is measured and a processing condition of forming the pattern of the organic film is corrected based on the measured result.

8. The method of claim 1, wherein, when forming the pattern of the organic film, a photolithography processing is performed on the substrate to form a resist pattern on the film to be processed of the substrate, and the resist pattern is trimmed and an antireflection film under the resist pattern is etched to form the resist pattern and a pattern of the antireflection film as the pattern of the organic film.

9. The method of claim 1, wherein, when forming the pattern of the organic film, a photolithography processing is performed on the substrate to form a resist pattern on the film to be processed of the substrate, the resist pattern is trimmed and an antireflection film under the resist pattern is etched, and the resist pattern is removed to form a pattern of the antireflection film as the pattern of the organic film.

10. A method of manufacturing a semiconductor device, comprising:

forming a pattern of an organic film on a film to be processed of a substrate;

forming a silicon nitride film having a film stress of 100 MPa or less on the pattern of the organic film by conducting a plasma processing using a plasma generated by exciting a processing gas while maintaining temperature of the substrate at 100° C. or lower;

etching the silicon nitride film such that the silicon nitride film remains only on a lateral wall section of the pattern of the organic film;

removing the pattern of the organic film, thereby forming a predetermined pattern of the silicon nitride film on the film to be processed of the substrate; and etching the film to be processed on the substrate using the predetermined pattern of the silicon nitride film as a mask, thereby manufacturing the semiconductor device.

* * * * *